United States Patent
Roberts

(10) Patent No.: US 6,190,989 B1
(45) Date of Patent: Feb. 20, 2001

(54) METHOD FOR PATTERNING CAVITIES AND ENHANCED CAVITY SHAPES FOR SEMICONDUCTOR DEVICES

(75) Inventor: Ceredig Roberts, Boise, ID (US)

(73) Assignee: Micron Technology, Inc., Boise, ID (US)

(*) Notice: Under 35 U.S.C. 154(b), the term of this patent shall be extended for 0 days.

(21) Appl. No.: 09/115,700

(22) Filed: Jul. 15, 1998

(51) Int. Cl.⁷ .................................................. H01L 21/20
(52) U.S. Cl. ............................................................ 438/396
(58) Field of Search .................................... 438/396, 399, 438/401, 424, 426, 427, 428, 445, 576, 229; 430/325, 312, 5

(56) References Cited

U.S. PATENT DOCUMENTS

| | | |
|---|---|---|
| 4,577,395 | 3/1986 | Shibata . |
| 5,354,711 | 10/1994 | Heitzmann et al. . |
| 5,413,898 * | 5/1995 | Kim et al. ............................. 430/325 |
| 5,523,258 * | 6/1996 | Petti et al. ............................. 437/186 |
| 5,963,814 * | 10/1999 | Walker et al. ....................... 438/387 |

FOREIGN PATENT DOCUMENTS

4235702 A1   4/1994   (DE) .

* cited by examiner

Primary Examiner—David Nelms
Assistant Examiner—Quoc Hoang
(74) Attorney, Agent, or Firm—Dickstein Shapiro Morin & Oshinsky, LLP

(57) ABSTRACT

A method of forming an opening within a surface of a semiconductor substrate while minimizing the effects of lithographic rounding. A semiconductor substrate is patterned using a first hard mask with features aligned in a first direction and a second soft mask with features aligned in a second direction.

22 Claims, 15 Drawing Sheets

METHOD FOR PATTERNING CAVITIES AND ENHANCED CAVITY SHAPES FOR SEMICONDUCTOR DEVICES

FIELD OF THE INVENTION

The invention relates generally to integrated circuits and more particularly to enhanced shapes and the fabrication of enhanced shapes for openings or cavities for container capacitors and other structures in integrated circuit devices.

BACKGROUND OF THE INVENTION

In semiconductor fabrication, it is often necessary to create openings or cavities into which selected materials can be deposited. While the invention is primarily discussed with respect to capacitors, it is to be understood that the invention is applicable in all areas of semiconductor fabrication where openings are formed such as in the creation of polysilicon plugs, bit line contacts and various other structures.

Capacitors are used in a wide variety of semiconductor circuits. Capacitors are of special concern in DRAM (dynamic random access memory) memory circuits; therefore, the invention will be discussed in connection with DRAM memory circuits.

DRAM memory circuits are manufactured by replicating millions of identical circuit elements, known as DRAM cells, on a single semiconductor wafer. A DRAM cell is an addressable location that can store one bit (binary digit) of data. In its most common form, a DRAM cell consists of two circuit components: a storage capacitor and an access field effect transistor.

FIG. 1 illustrates a portion of a DRAM memory circuit containing two neighboring DRAM cells 10. For each cell, one side of the storage capacitor 14 is connected to a reference voltage, which is typically one half of the internal operating voltage (the voltage corresponding to a logical "1" signal) of the circuit. The other side of the storage capacitor 14 is connected to the drain of the access field effect transistor 12. The gate of the access field effect transistor 12 is connected to a signal referred to as the word line 18. The source of the field effect transistor 12 is connected to a signal referred to as the bit line 16. With the circuit connected in this manner, it is apparent that the word line controls access to the storage capacitor 14 by allowing or preventing the signal (a logic "0" or a logic "1") on the bit line 16 to be written to or read from the storage capacitor 14.

DRAM manufacturing is a highly competitive business. There is continuous pressure to decrease the size of individual cells and increase memory cell density to allow more memory to be squeezed onto a single memory chip. However, it is necessary to maintain a sufficiently high storage capacitance to maintain a charge at the refresh rates currently in use even as cell size continues to shrink. This requirement has led DRAM manufacturers to turn to three dimensional capacitor designs, including trench and stacked capacitors. Stacked capacitors are capacitors which are placed over the access transistor in a semiconductor device. In contrast, trench capacitors are formed in the wafer substrate beneath the transistor. For ease of fabrication and increased capacitance, most manufacturers of DRAMs larger than 4 Megabits use stacked capacitors. Therefore, the invention will be discussed in connection with stacked capacitors but should not be understood to be limited thereto. Use of the invention to fabricate trench, planar or other capacitors is also possible.

One widely used type of stacked capacitor is known as a container capacitor. Known container capacitors are in the shape of an upstanding tube (cylinder) having an oval or circular cross section. The wall of the tube consists of two plates of conductive material such as doped polycrystalline silicon (referred to herein as polysilicon or poly) separated by a dielectric. The bottom end of the tube is closed, with the outer wall in contact with either the drain of the access transistor or a plug which itself is in contact with the drain. The other end of the tube is open (the tube is filled with an insulative material later in the fabrication process). The sidewall and closed end of the tube form a container; hence the name "container capacitor." Although the invention will be further discussed in connection with stacked container capacitors, the invention should not be understood to be limited thereto.

In a typical fabrication process, capacitors such as stacked container capacitors are formed by patterning a surface to produce an opening or container cell, which is then filled with conductive materials such as hemispherical grained poly (HSG) or the like and with cell dielectric material. The amount of material which can be deposited within the container cell determines the capacitance of the capacitor. The volume of the container cell per given substrate area is therefore very important.

The patterning process of a container cell typically involves forming protective layers or masks which selectively shield underlying layers from etching. Masks are generally classified as soft masks or hard masks. A soft mask is manufactured by coating a thin layer of photoresist on a substrate. This photoresist is then exposed to a light source through a mask or reticle which defines a pattern in the photoresist. Depending on whether a positive or negative photoresist is used, the exposed portions of the photoresist are made either soluble or insoluble, respectively, in a developer. As a result, a patterned photoresist layer remains over the underlying layer after the photoresist is developed. Those portions of the underlying layer which are not covered by photoresist may then be etched using suitable etch techniques and chemistries. The pattern in the photoresist is thus replicated in the underlying layer.

Hard masks are manufactured by coating a thin layer of material on the substrate by means of deposition, sputtering or chemical vapor deposition. Materials such as sodalime or borosilicate can be used in forming the hard mask. Once deposited, the thin layer of hard mask material is then patterned using a soft mask as detailed above. The patterned hard mask then acts as a physical barrier to any subsequent etching of underlying layers covered by the hard mask.

A key limitation encountered in the above processes is lithographic rounding. Lithographic rounding occurs as a result of radiation diffraction around the edges and corners in the mask through which the photoresist is exposed. Additional lithographic rounding may be caused by the rounding of edges on the reticle itself. As illustrated in FIG. 2, due to lithographic rounding, even when using a reticle 102 containing sharply defined edges, the resulting pattern 104, exposed onto the surface of the photoresist 98, is rounded. As illustrated in FIG. 3, when the underlying surface 148 is etched using this patterned photoresist 98, the rounding effect is replicated in the patterned polysilicon 148. The lithographic rounding effect reduces the volume of the resulting capacitor cell 106 and, therefore, the capacitance is also reduced.

Petti et al., U.S. Pat. No. 5,523,258, refers to a method for using separate masks to pattern a layer of material formed over a semiconductor substrate in the fabrication of a transistor. Petti et al., however, does not teach or suggest a method for reducing the effects of lithographic rounding in the formation of openings or cavities. Rather, Petti et al. refers to patterning gate transistor material in a first direction with a single mask and then "cutting" the gate transistor material with a second mask orthogonal to the first.

As memory cell density continues to increase, efficient use of space becomes ever more important. Thus, what is needed is a process which reduces or avoids lithographic rounding effects in the fabrication of capacitors and other structures which require the formation of cavities.

SUMMARY OF THE INVENTION

The invention provides methods for patterning structures while minimizing lithographic rounding effects. The invention also provides for an enhanced capacitor shape and a method for patterning a capacitor cell which maximizes the volume of the resulting cell.

In accordance with the invention, openings are formed by patterning a surface of a semiconductor substrate using a first mask having features aligned in a first direction and a second mask having features aligned in a second direction. The term "substrate" herein means one or more semiconductor layers or structures which include active or operable portions of semiconductor devices; the terms "substrate" and "semiconductor substrate" herein are not limited to only the underlying silicon or other wafer material itself, but also include any layers thereon. According to a first aspect of the invention, the direction of the features of said first and second masks are orthogonal or substantially orthogonal to one another. According to a second aspect of the invention, the direction of the features of said first and second masks are substantially non-orthogonal to one another. In accordance with a preferred embodiment, container capacitor cells are fabricated by patterning an insulating layer of material using a first hard mask having features aligned in a first direction and a second soft mask having features aligned in a second direction. According to a most preferred embodiment, the direction of the features on said first and second masks are orthogonal or substantially orthogonal to one another. The resulting capacitor cell has a cross sectional shape which is enhanced due to the avoidance or minimization of the lithographic rounding effects found in prior capacitor cells and, accordingly, has an improved capacitance over such cells for a given area of substrate.

DETAILED DESCRIPTION OF THE PREFERRED EMBODIMENTS

An exemplary construction of a fabrication process for a container capacitor according to one embodiment of the present invention is described below. It is to be understood, however, that this process is only one example of many possible processes. For example, BPSG is used in the preferred embodiment to insulate between conductive layers and to encase the capacitor cell. Other insulating material can also be used such as phosphosilicate glass (PSG) or silicon dioxide ($SiO_2$). As another example, the plugs under the capacitors formed by the following process could be eliminated. The invention is not intended to be limited by the particular structure or process described below.

Figure 1:
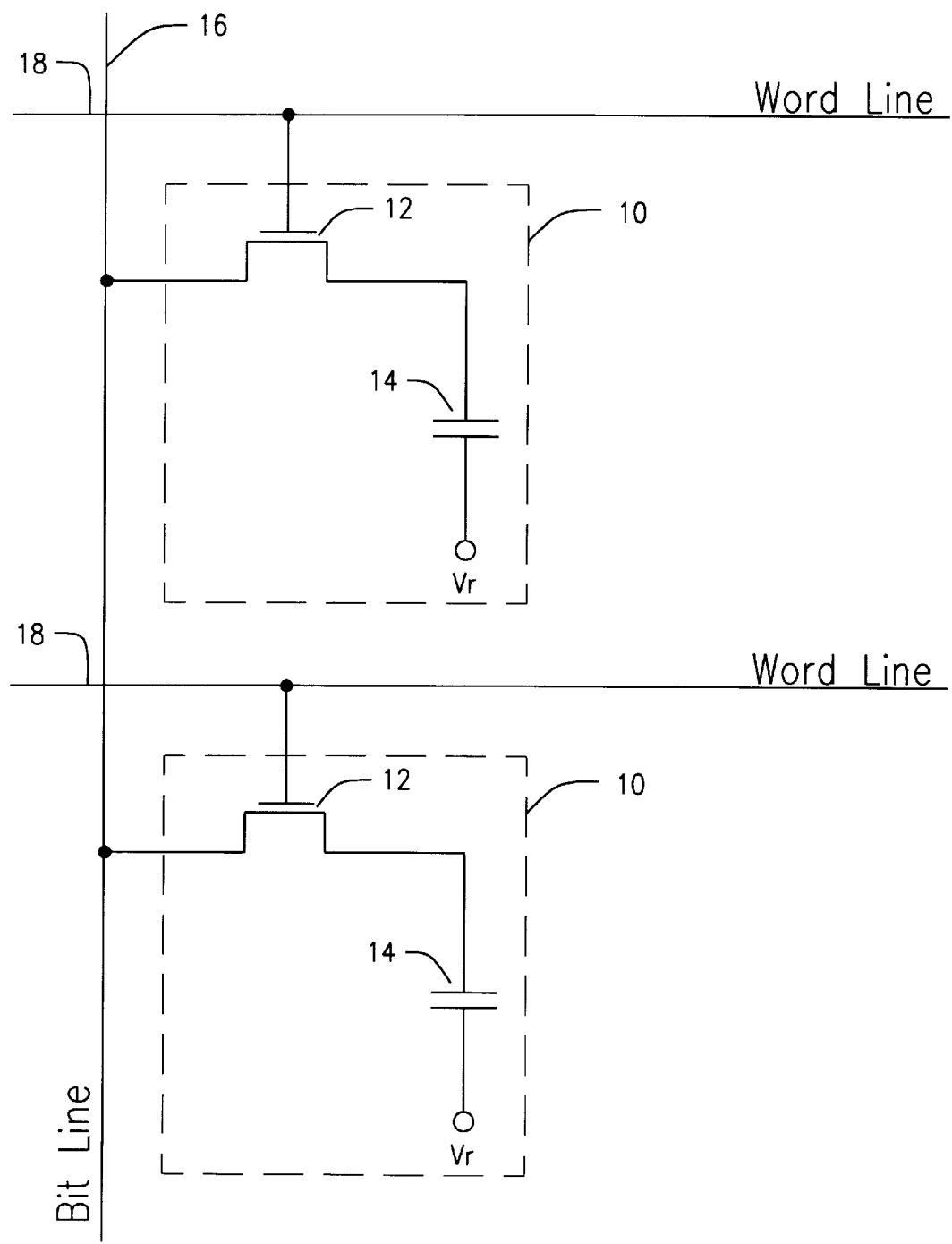
FIG. 1 is a circuit diagram of a portion of a conventional DRAM memory circuit.
Figure 2:
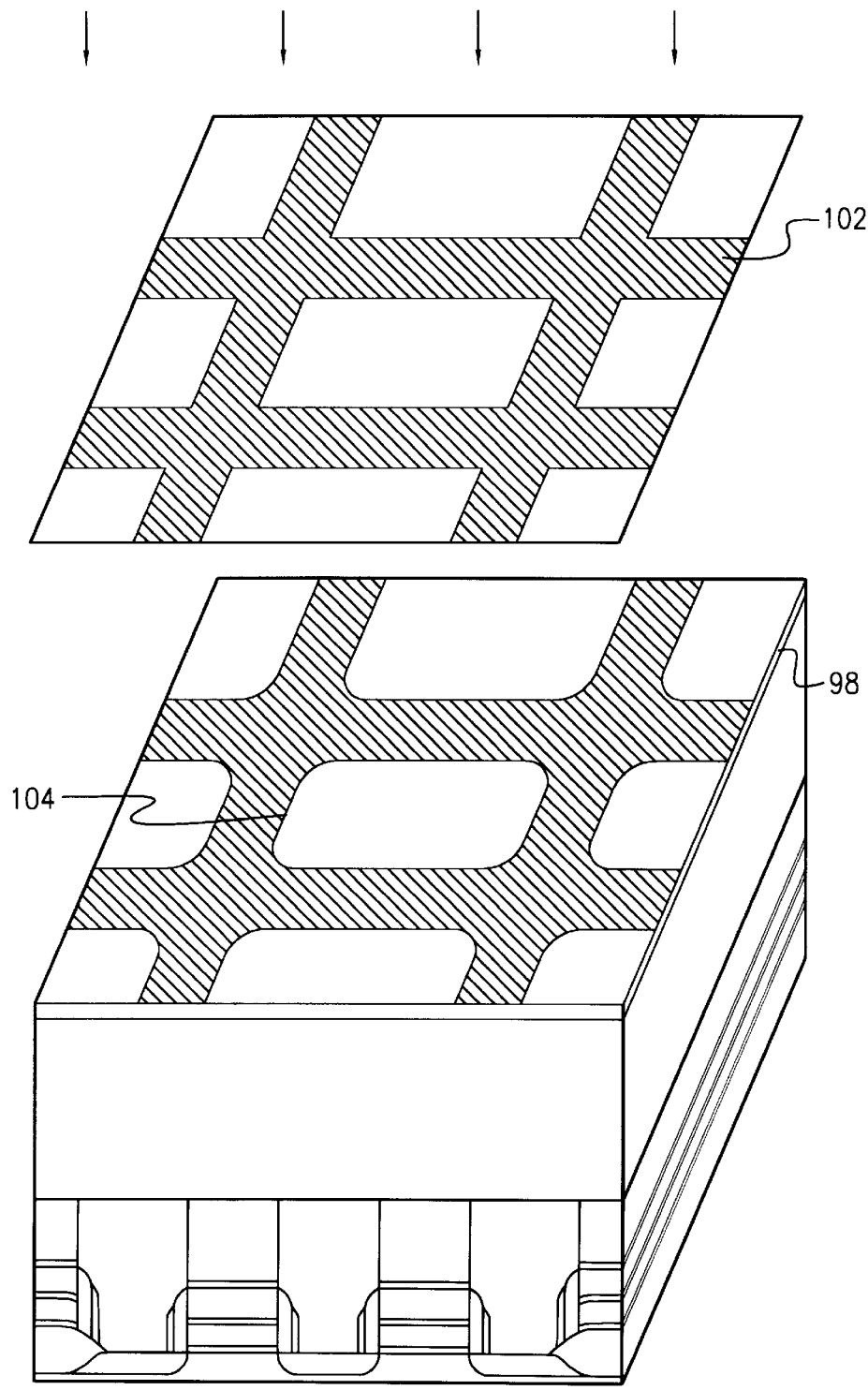
FIG. 2 is a perspective, partial cross-sectional view of a semiconductor wafer undergoing conventional single-mask photolithography to form capacitor cells.
Figure 3:
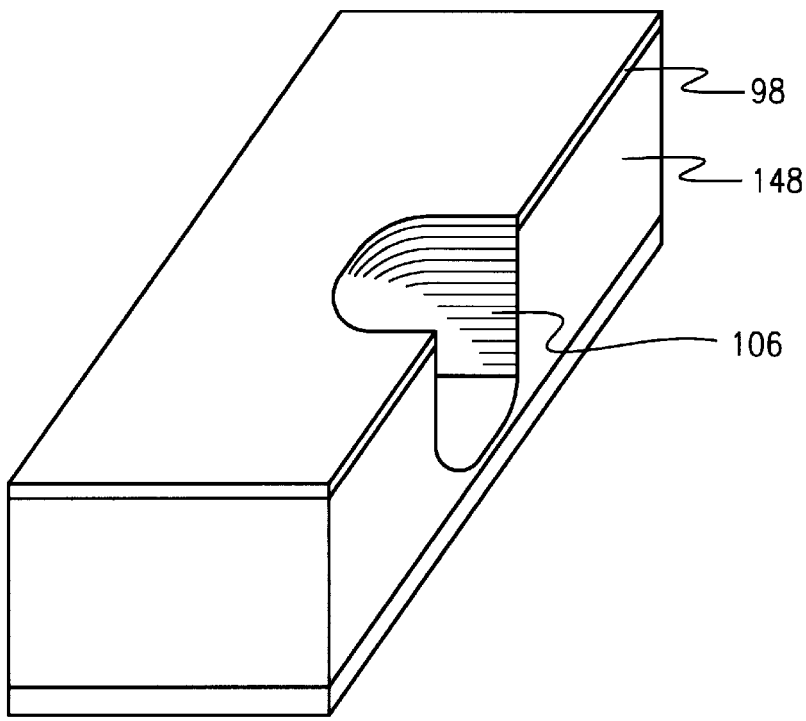
FIG. 3 is a perspective, partial cross-sectional view of the semiconductor wafer of FIG. 2 illustrating the resulting capacitor cell formed after patterning.
Figure 4:
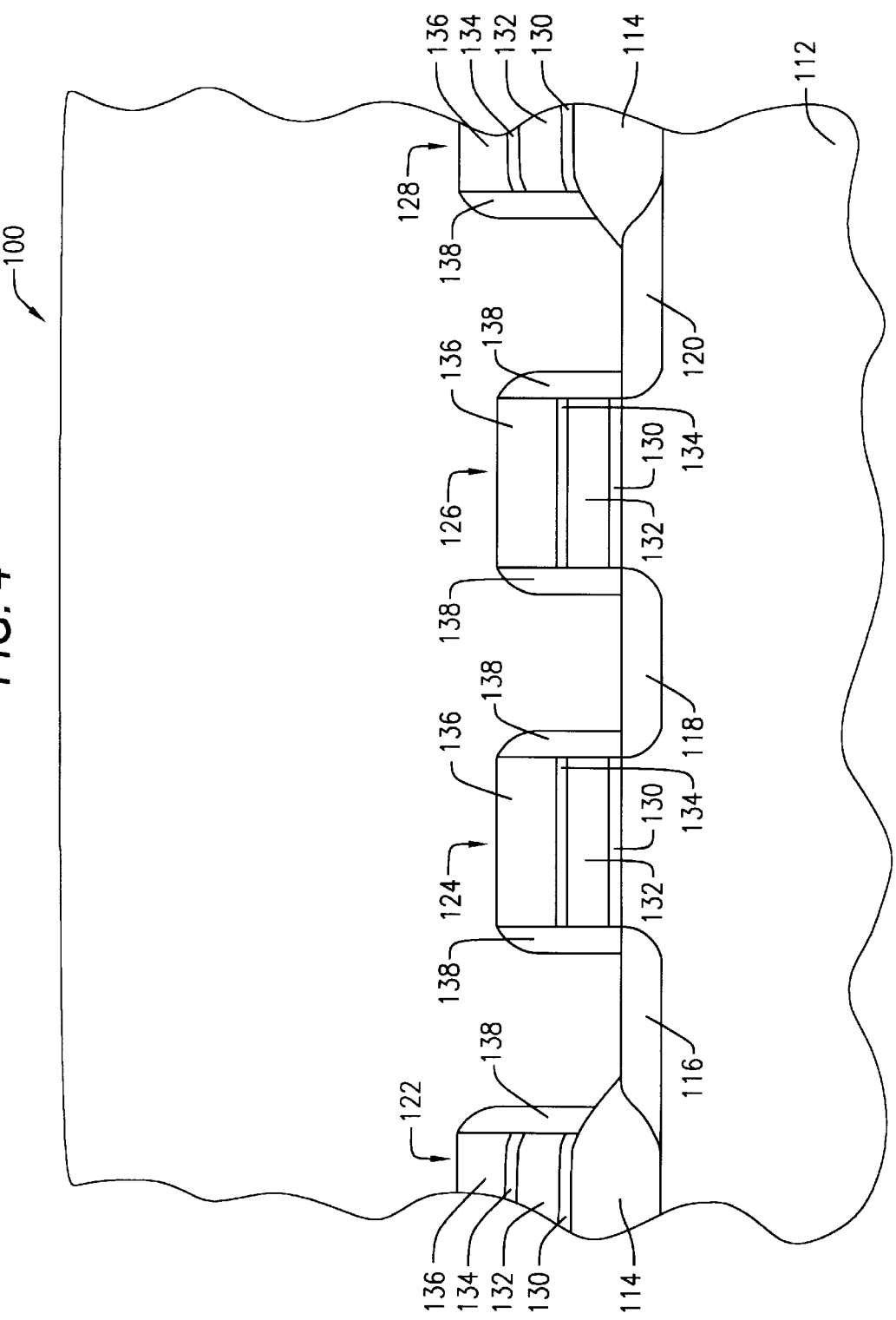
FIG. 4 is a diagrammatic cross-sectional view of a portion of a semiconductor wafer at an early processing step according to one embodiment of the present invention.

Referring now to FIG. 4, a semiconductor wafer fragment at an early processing step is indicated generally by reference numeral 100. The semiconductor wafer 100 is comprised of a bulk silicon substrate 112 with field isolation oxide regions 114 and active areas 116, 118, 120 formed therein. Word lines 122, 124, 126, 128 have been constructed on the wafer 100 in a conventional manner. Each word line consists of a lower gate oxide 130, a lower poly layer 132, a higher conductivity silicide layer 134 and an insulating silicon nitride cap 136. Each word line has also been provided with insulating spacers 138, which are also composed of silicon nitride.

Two FETs are depicted in FIG. 4. One FET is comprised of two active areas (source/drain) 116, 118 and one word line (gate) 124. The second FET is comprised of two active areas (source/drain) 118, 120 and a second word line (gate) 126. The active area 118 common to both FETs is the active area over which a bit line contact will be formed.

Figure 5:
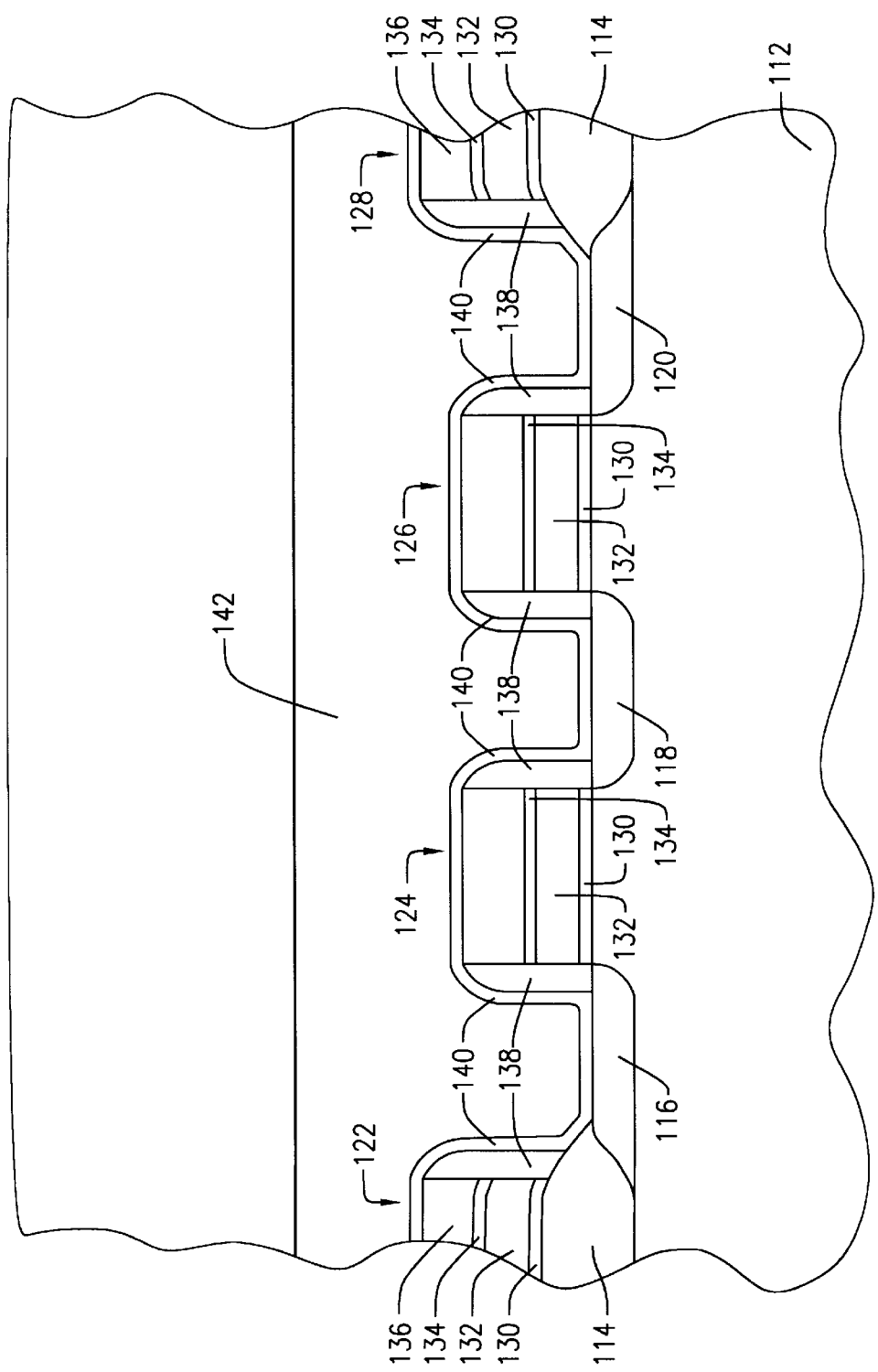
FIG. 5 is a diagrammatic cross-sectional view of a portion of a semiconductor wafer at a processing step subsequent to that shown in FIG. 4.

Referring now to FIG. 5, a thin layer 140 of nitride or TEOS (tetraethyl orthosilicate) is then provided atop the wafer 100. Next a layer of insulating material 142 is deposited. The insulating material preferably consists of borophosphosilicate glass (BPSG). The insulating layer 142 is subsequently planarized by chemical-mechanical polishing (CMP).

Figure 6:
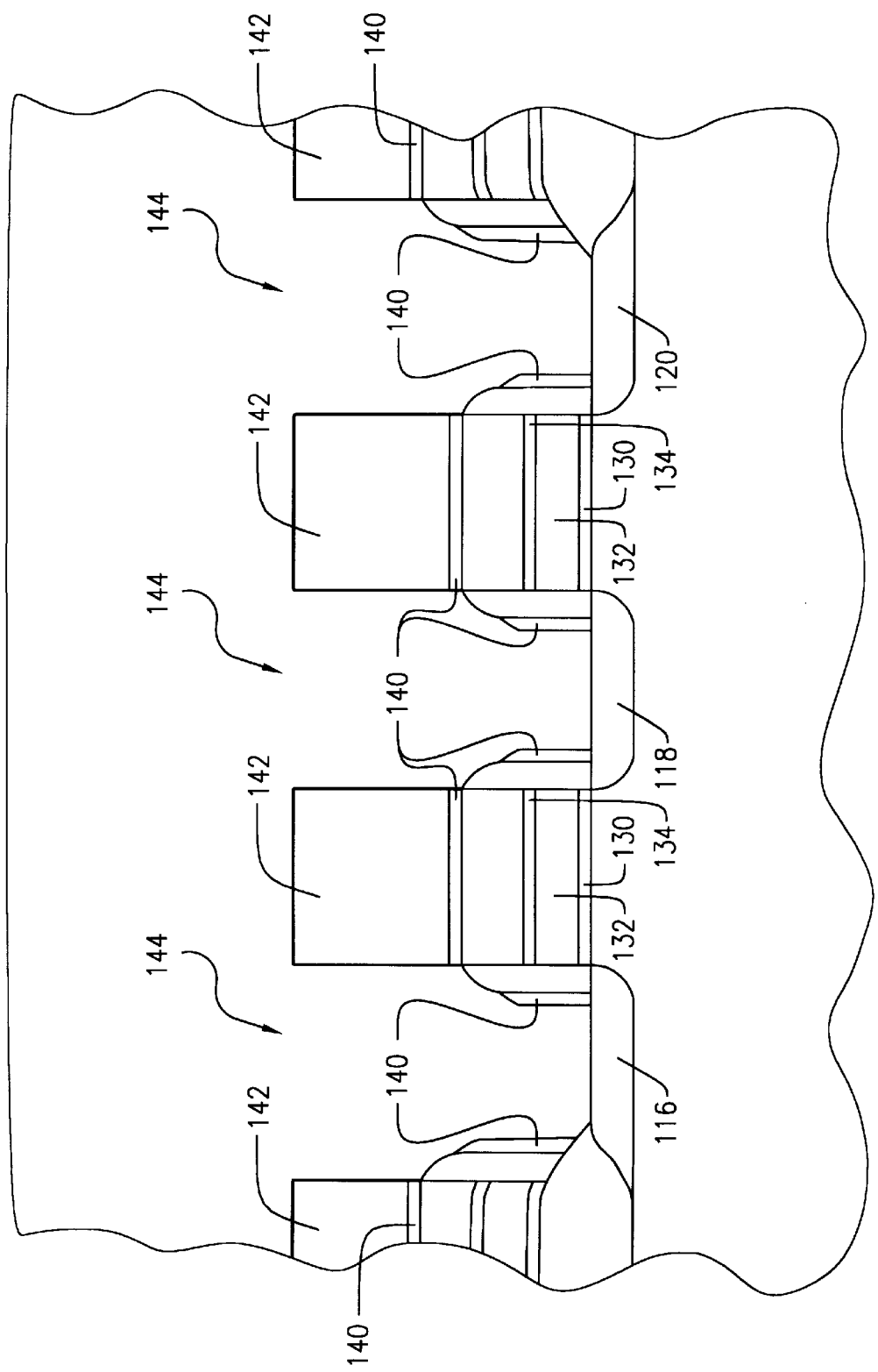
FIG. 6 is a diagrammatic cross-sectional view of a portion of a semiconductor wafer at a processing step subsequent to that shown in FIG. 5.
Figure 7:
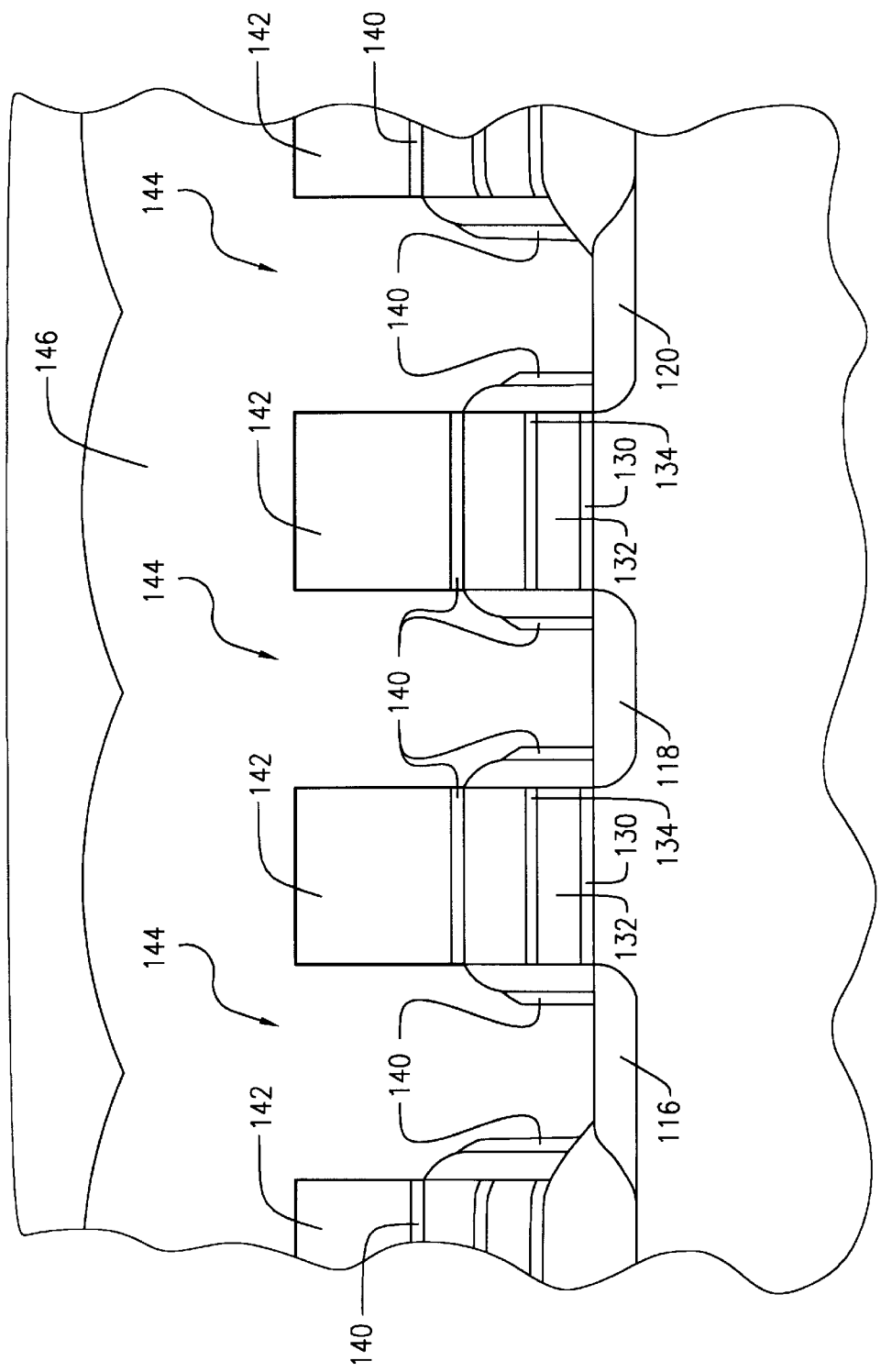
FIG. 7 is a diagrammatic cross-sectional view of a portion of a semiconductor wafer at a processing step subsequent to that shown in FIG. 6.
Figure 8:
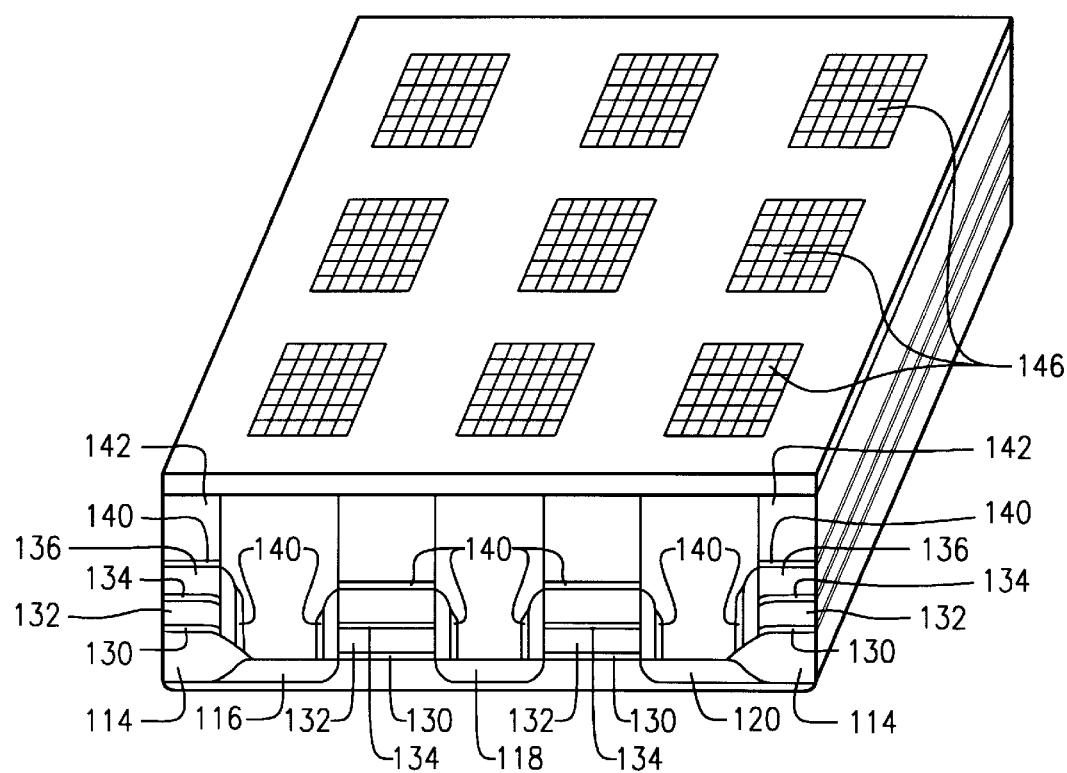
FIG. 8 is a perspective, partial cross-sectional view of a portion of a semiconductor wafer at a processing step subsequent to that shown in FIG. 7.

Referring now to FIG. 6, plug openings 144 have been formed through the insulating layer 142. The plug openings 144 are formed through the insulating layer 142 by photo-masking and dry chemical etching the BPSG relative to the thin nitride layer 140. These openings may be patterned if desired, using two separate masks as discussed below in connection with patterning of the capacitor cell opening. Referring now to FIG. 7, a layer 146 of conductive material is deposited to provide conductive material within the plug openings 144. The conductive layer 146 is in contact with the active areas 116, 118, 120. Suitable examples of the material used to form layer 146 are in situ arsenic and phosphorous doped poly. Referring now to FIG. 8, the conductive layer 146 is dry etched (or chemical-mechanical polished) to a point just below the upper surface of the BPSG layer 142 such that the remaining material of the conductive layer 146 forms electrically isolated plugs 146 over the active areas 116, 118, 120.

Figure 9:
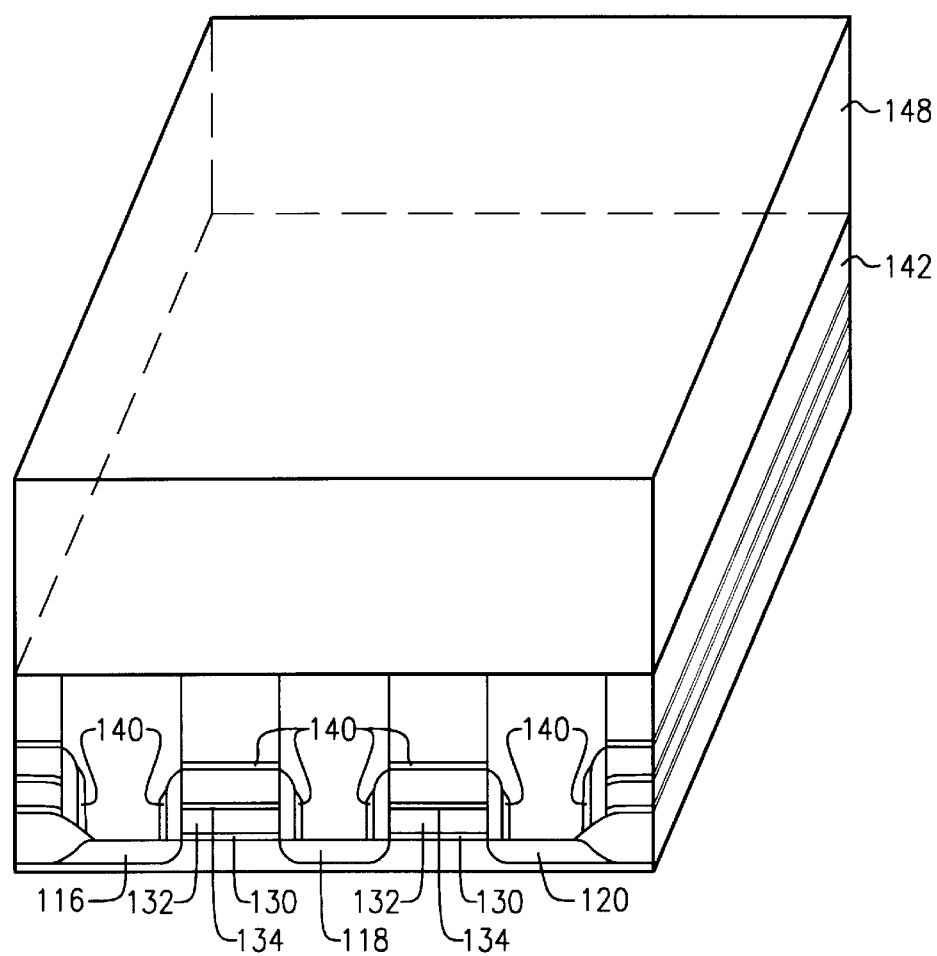
FIG. 9 is a perspective, partial cross-sectional view of a portion of a semiconductor wafer at a processing step subsequent to that shown in FIG. 8.

Referring to FIG. 9, a container cell layer 148 is then deposited on the structure of FIG. 8. According to the preferred embodiment, the container cell layer 148 is formed of BPSG. In alternative embodiments, however, the container cell layer 148 may be formed of other insulating material such as phosphosilicate glass (PSG) or silicon dioxide ($SiO_2$)

Figure 10:
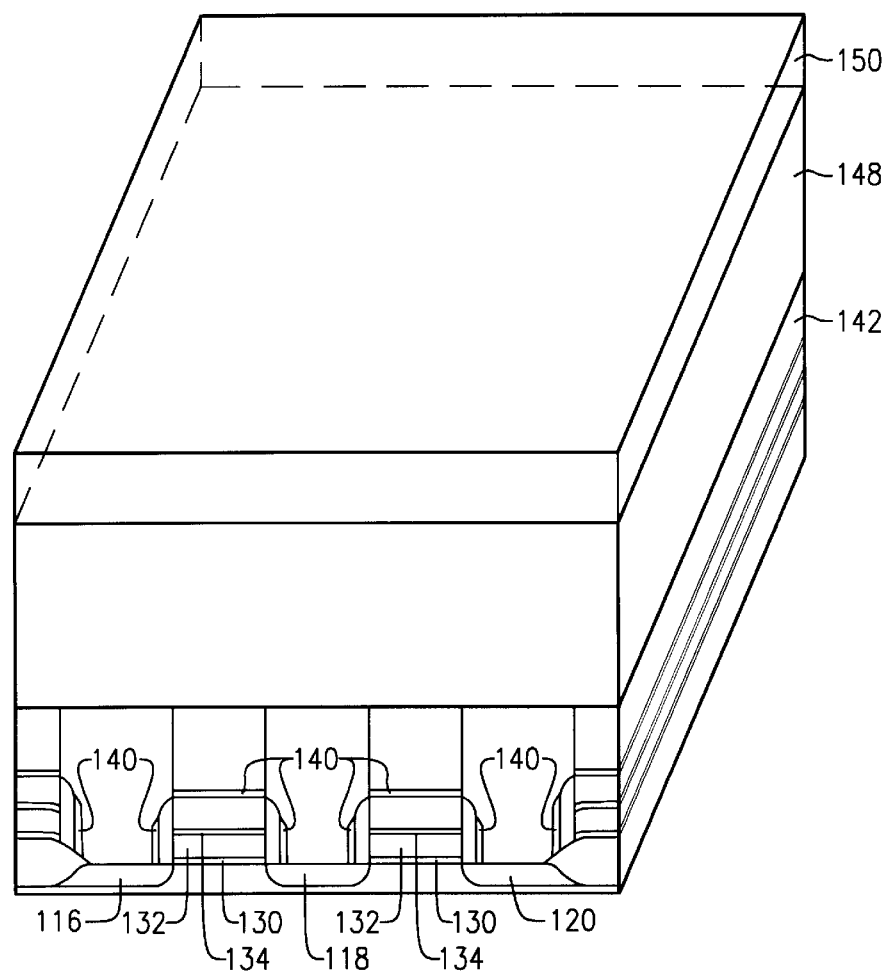
FIG. 10 is a perspective, partial cross-sectional view of a portion of a semiconductor wafer at a processing step subsequent to that shown in FIG. 9.

Referring to FIG. 10, a first mask layer 150 is then formed over the container cell layer 148. The first mask layer 150 according to the preferred embodiment is a hard mask layer; however, a soft mask may also be used. Additionally, the first mask layer 150 may contain any suitable material or materials which may be patterned to provide for a mask when the underlying container cell layer 148 is etched. For example, it may be comprised of silicon dioxide ($SiO_2$) or silicon nitride ($Si_3N_4$), preferably deposited to a thickness of about 200 to 2000 Angstroms. Other thicknesses of these materials may also be used depending, for example, on the depositional technique used to form the mask layer 150 or the etch technique used to etch the mask layer 150. The mask layer may be deposited using chemical vapor deposition (CVD) or the like. Further, where the mask layer comprises silicon dioxide ($SiO_2$), it may be deposited or grown over the underlying container cell layer 148.

Figure 11:
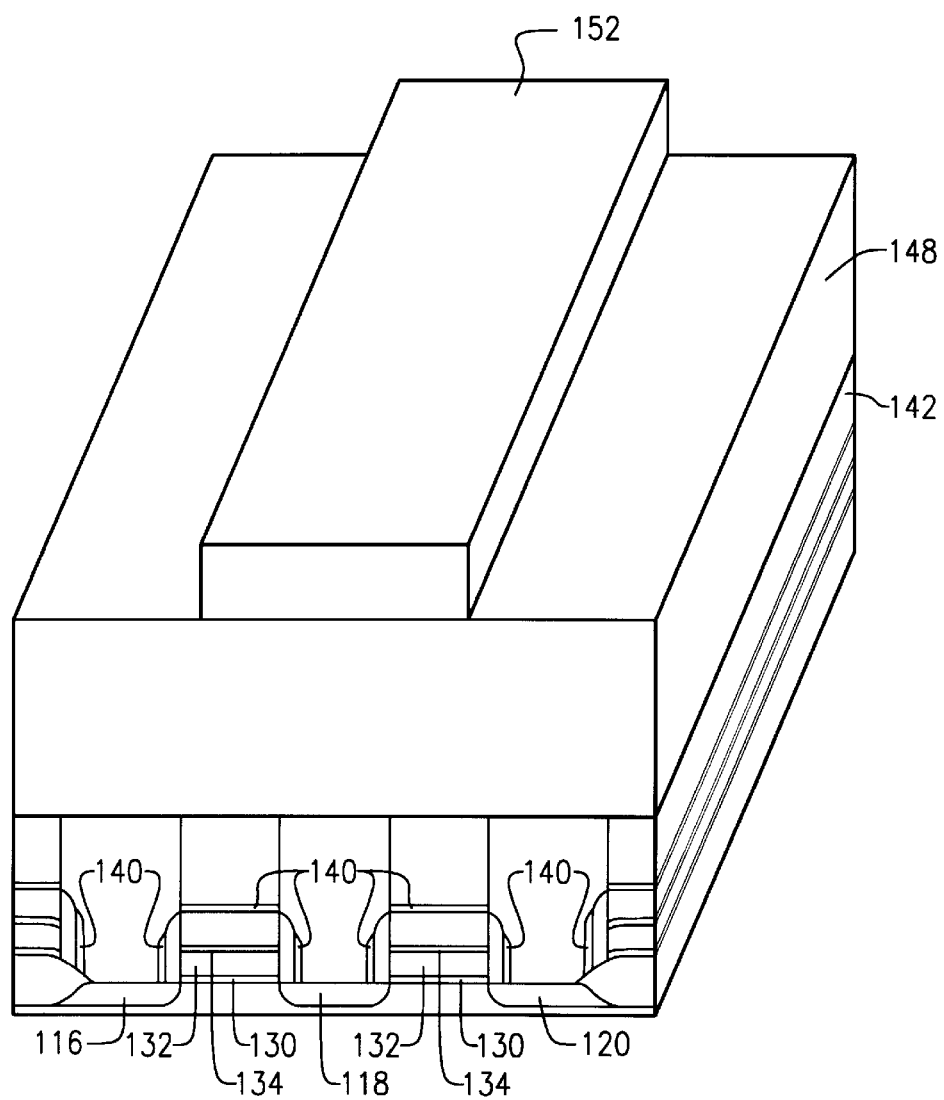
FIG. 11 is a perspective, partial cross-sectional view of a portion of a semiconductor wafer at a processing step subsequent to that shown in FIG. 10.

Referring to FIG. 11, the mask layer 150 of FIG. 10 is then patterned to define the hard mask 152. In patterning the mask layer 150, any suitable patterning process may be used. For example, a layer of photosensitive material such as photoresist may be formed over the mask layer 150, exposed to radiation such as ultraviolet radiation through a suitable mask, and developed to define in the photosensitive material the material to be etched in order to form the mask line pattern of the hard mask 152. The mask line pattern is then etched using a suitable etch technique and chemistry. For example, a timed or endpoint etch may be used. The etch may be selective to the composition of the underlying container cell layer 148 in order to protect the container cell layer 148 not covered by the mask.

Figure 12:
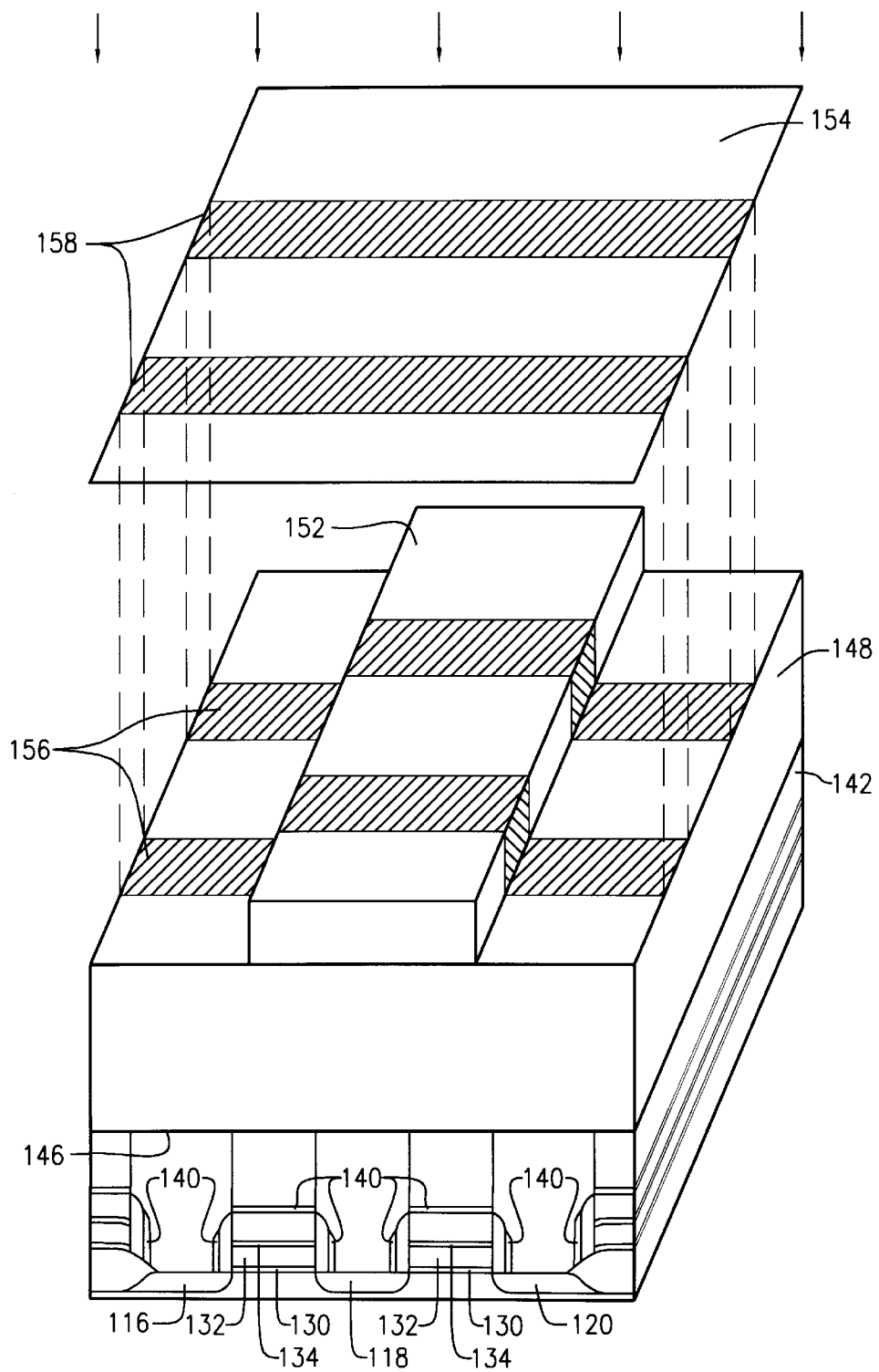
FIG. 12 is a perspective, partial cross-sectional view of a portion of a semiconductor wafer at a processing step subsequent to that shown in FIG. 11.

Referring to FIG. 12, once the hard mask 152 is formed, a soft mask 164 is provided and used in conjunction with hard mask 152 to pattern the container cell layer 148. The soft mask layer 164 is formed of a thin layer of photoresist, which is exposed to suitable radiation, such as ultraviolet radiation, through a reticle 154. The reticle 154 contains a line pattern 158 which is defined in the photoresist as soft mask line pattern 156. According to a first preferred embodiment, the soft mask line pattern 156 is defined to be orthogonal to the features defined by the hard mask 152 SO as to etch square or rectangular shaped capacitor cells having sharply defined interior right angle corners within the container cell layer 148. According to a second embodiment, the soft mask line pattern 156 is defined to be substantially non-orthogonal to the features defined by the hard mask 152 SO as to define non-rectangular shaped capacitor cells within the container cell layer 148. In alternative embodiments, the features of the soft mask and the hard mask 152 may define a variety of features to include, for example, triangular and trapezoidal shapes, as well as other geometric shapes containing more than four sides such as pentagons, hexagons or such. In each such embodiment, the cell shape is enhanced due to the sharply defined interior corners and avoidance or minimization of lithographic rounding effects.

In patterning the container cell layer 148 using hard mask 152 and soft mask 164, any suitable patterning process may be used. The resulting features etched in the container cell layer 148 are defined by the soft mask line pattern 156 and the hard mask 152. Any suitable radiation such as ultraviolet radiation may be used to define the soft mask line pattern 156. Once defined, the underlying container cell layer 148 is etched using a suitable etch technique and chemistry. For example, a timed or endpoint etch may be used. The etch may be selective to the composition of the underlying insulating layer 142 and the polysilicon plugs 146 in order to protect against overetching.

Figure 13:
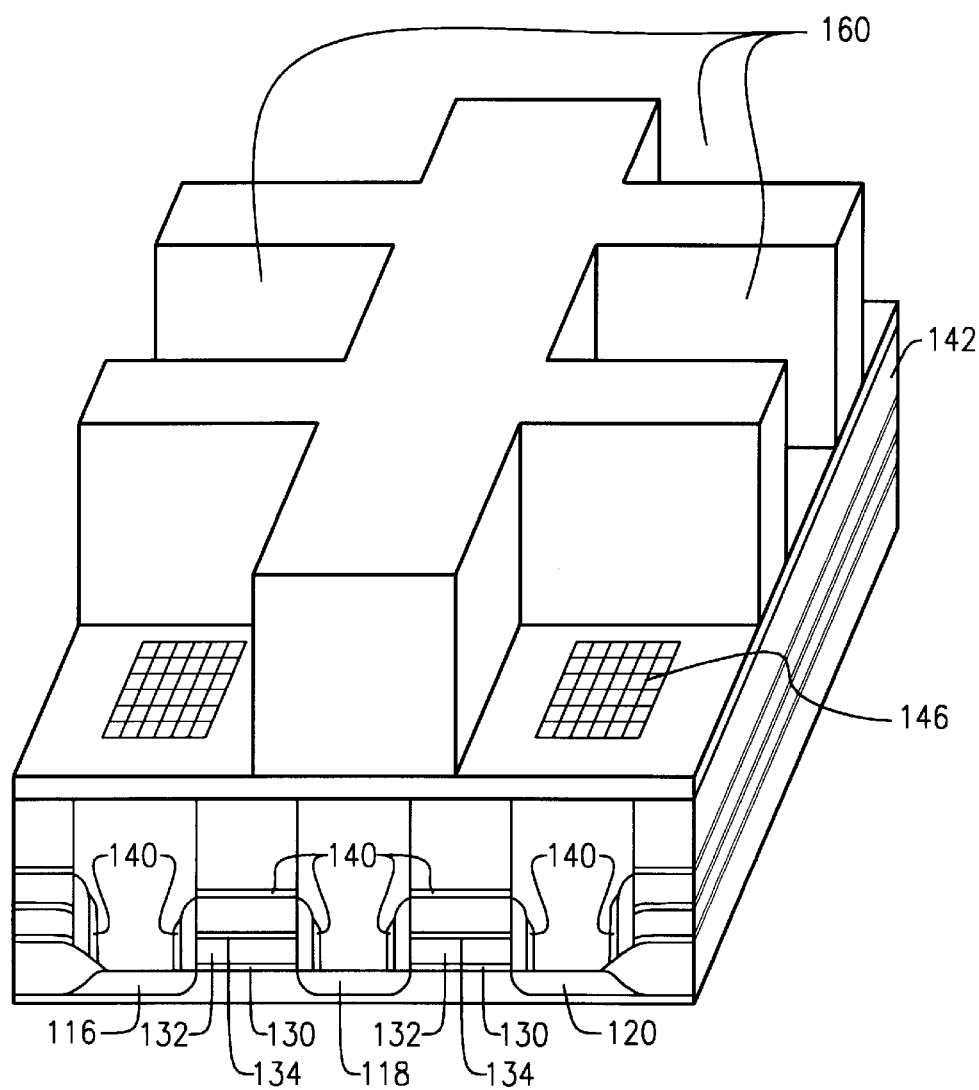
FIG. 13 is a perspective, partial cross-sectional view of a portion of the semiconductor wafer at the processing step shown in FIG. 12 illustrating the resulting capacitor cells formed after patterning.

Referring now to FIG. 13, the resulting capacitor cells 160 patterned in accordance with the preferred embodiment of the present invention as illustrated in FIG. 12 are shown. The rectangular shape of the resulting capacitor cells 160 are but one example of the sharply defined interior corners and shapes which may be formed. Square, triangular and trapezoidal shapes may also be formed as well as other geometric shapes containing more than four sides such as pentagons, hexagons or such. Each of such shapes is enhanced by the process and structures provided by the present invention in that since lithographic rounding is avoided or minimized, the resultant cells will have increased cross-sectional area as compared to the prior art cells and cavities. As a result, semiconductor space is optimized, capacitance is increased, and features can be made smaller without undue concern for overlap and concomitant short circuits, parasitic capacitance and the like.

Figure 14:
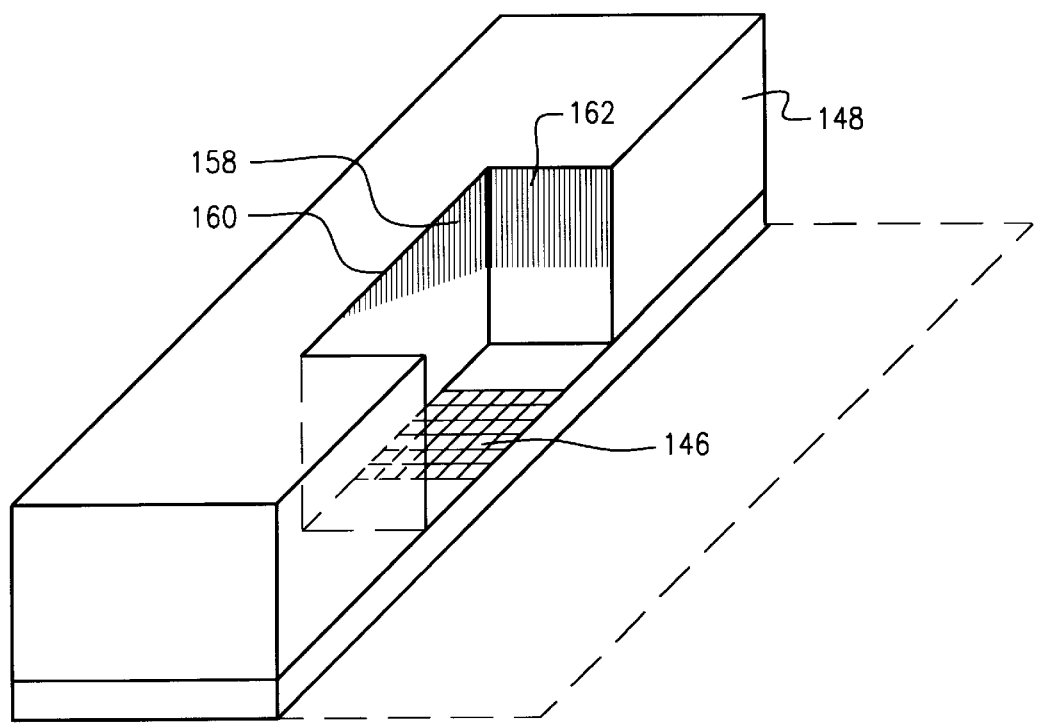
FIG. 14 is a perspective, partial cross-sectional view of a capacitor cell formed in accordance with the preferred embodiment.

The advantages of fabricating capacitors in accordance with the present invention will now be discussed in further detail with reference to FIG. 14. FIG. 14 is a perspective, partial cross-sectional view of a capacitor cell 160 formed in accordance with the preferred embodiment. As illustrated, by using two separate masks to define the capacitor cell area within the capacitor cell layer 148, lithographic rounding has been eliminated and the resulting capacitor cell walls 158, 162 meet at a sharply defined edge. Accordingly, the cross-sectional area and capacitance achieved per semiconductor area is maximized.

Figure 15:
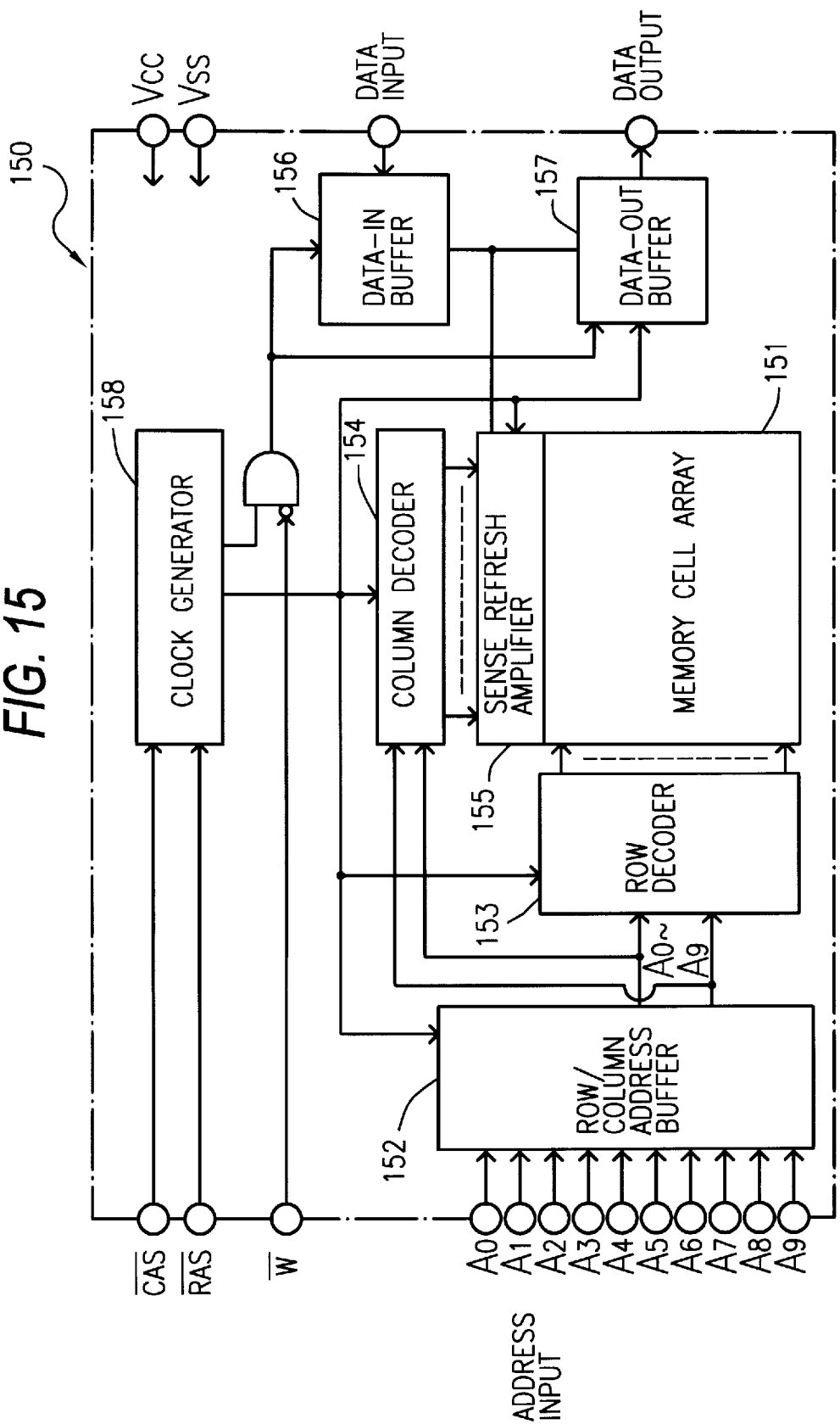
FIG. 15 is a block diagram showing the general structure of a DRAM within a computer system.

FIG. 15 is a block diagram of a DRAM according to the present invention illustrating the use of the present invention within the memory cell array of a computer system. Referring to FIG. 15, DRAM 150 includes: a memory cell array 151 for storing data signals of memory information; a row and column address buffer 152 for receiving external address signals for selecting a memory cell (constituting a unit memory circuit); a row decoder 153 and a column decoder 154 for designating the memory cell by decoding the address signals; a sense refresh amplifier 155 for amplifying and reading a signal stored in the designated memory cell; a data in buffer 156 and a data out buffer 157 for inputting/outputting data; and a clock generator 158 for generating a clock signal.

A method for avoiding lithographic rounding effects in capacitor cell fabrication has thus been described. While the above description describes the use of the present invention with regard to forming container capacitors, it is to be appreciated that the present invention may also be used in patterning or etching cells and openings for purposes other than those with regard to the formation of container capacitors. For example, openings for polysilicon plugs and bit-line contacts may also be formed using the present invention.

Further, it should be noted that although the invention has been described with specific reference to DRAM memory circuits, the invention has broader applicability and may be used in any integrated circuit design such as SRAM or SCRAM. Similarly, the process described above is but one method of many that could be used. Accordingly, the above description and accompanying drawings are only illustrative of preferred embodiments which can achieve and provide the objects, features and advantages of the present invention. It is not intended that the invention be limited to the embodiments shown and described in detail herein. The invention is only limited by the spirit and scope of the following claims.

What is claimed as new and desired to be protected by Letters Patent of the United States is:

1. A method of forming a container opening within a surface of a semiconductor substrate, comprising the steps of:
    locating a first mask layer over said semiconductor substrate;
    while said first mask layer is located over said semiconductor substrate, removing portions of said first mask layer to form a first mask having features aligned in a first direction;
    providing a second mask having features aligned in a second direction; and
    etching said container opening in said semiconductor surface using said first and second masks in combination, wherein substantially all of said first mask remains intact after said etching of said container opening.

2. The method of claim 1, wherein said first mask is a hard mask.

3. The method of claim 2, wherein said second mask is a soft mask.

4. The method of claim 3, wherein said first and second directions are orthogonal or substantially orthogonal to each other.

5. The method of claim 3, wherein said first and second directions are not substantially orthogonal to each other.

6. The method of claim 5, wherein the first mask is a material selected from the group consisting of silicon dioxide and silicon nitride.

7. The method of claim 6, wherein said semiconductor surface is a material selected from the group consisting of polysilicon, BPSG and PSG.

8. A method of forming container capacitors on a semiconductor substrate, comprising the steps of:
    locating a first mask layer over said semiconductor substrate;
    while said first mask layer is located over said semiconductor substrate, removing portions of said first mask layer to form a hard mask having features aligned in a first direction;
    subsequently, providing a soft mask having features aligned in a second direction;
    etching container cells within said substrate using said hard mask and said soft mask, wherein substantially all of said hard mask remains intact after said etching of said container cells; and
    providing conductive material within said container cells.

9. The method of claim 8, wherein said hard mask is comprised of features aligned in a first direction and said soft mask is comprised of features aligned in a second direction wherein said first and second directions are substantially orthogonal to each other.

10. The method of claim 8, wherein said hard mask is comprised of features aligned in a first direction and said soft mask is comprised of features aligned in a second direction wherein said first and second directions are not substantially orthogonal to each other.

11. The method of claim 10, wherein said semiconductor surface is a material selected from the group consisting of polysilicon, BPSG and PSG.

12. The method of claim 11, wherein said conductive material consists of HSG.

13. A method of fabricating DRAM comprising the steps of:
    providing a first insulating layer selected from the group consisting of polysilicon, BPSG and PSG;
    locating a first mask layer over said first insulating layer;
    while said first mask layer is located over said first insulating layer, removing portions of said first mask layer to form a hard mask on said first insulating layer, said hard mask having features aligned in a first direction;
    subsequently, providing a soft mask having features aligned in a second direction;
    etching container cells within said first insulating layer using said soft mask and said hard mask, wherein substantially all of said hard mask remains intact after said etching of said container cells; and
    providing conductive material within said container cells, wherein said conductive material comprises HSG.

14. The method of claim 13, wherein said first and second directions are orthogonal or substantially orthogonal to each other.

15. The method of claim 13, wherein said first and second directions are not substantially orthogonal to each other.

16. A method of forming container cells comprising the steps of:
    providing a first layer of material;
    locating a hard mask layer over said first layer of material;
    while said hard mask layer is located over said first layer of material, removing portions of said hard mask layer to produce a hard mask having features aligned in a first direction;
    subsequently, providing a layer of photoresist over said hard mask and said first layer of material;
    exposing said layer of photoresist to a light source to produce a soft mask having features which are aligned in a second direction;
    etching container cells within said first layer of material using said hard mask and said soft mask, wherein substantially all of said hard mask remains intact after said etching of said container cells; and
    providing conductive material within said container cells.

17. The method of claim 16, wherein said first and second directions are orthogonal or substantially orthogonal to each other.

18. The method of claim 16, wherein said first and second directions are not substantially orthogonal to each other.

19. The method of claim 16, wherein said hard mask is a material selected from the group consisting of silicon dioxide and silicon nitride.

20. The method of claim 16, wherein said first layer of material is selected from the group consisting of polysilicon, BPSG and PSG.

21. A method of forming container cells comprising the steps of:

providing a first layer of material;

providing a hard mask layer over said first layer of material;

patterning said hard mask layer to produce a hard mask having features aligned in a first direction;

providing a layer of photoresist over said hard mask and said first layer of material;

exposing said layer of photoresist to a light source to produce a soft mask having features which are aligned in a second direction;

etching container cells within said first layer of material using said hard mask and said soft mask, wherein substantially all of said hard mask remains intact after said etching of said container cells; and providing conductive material within said container cells;

wherein each container cell is comprised of at least four container walls forming the periphery of the container cell and on container floor which is the bottom surface within the container cell.

22. The method of claim 21, wherein each container wall is etched to be substantially orthogonal to the container floor.

* * * * *

UNITED STATES PATENT AND TRADEMARK OFFICE
CERTIFICATE OF CORRECTION

PATENT NO. : 6,190,989 B1
DATED : February 20, 2001
INVENTOR(S) : Ceredig Roberts It is certified that error appears in the above-identified patent and that said Letters Patent is hereby corrected as shown below:

Title page,
Item [56], References Cited, U.S. PATENT DOCUMENTS, change "5,354,711 10/1994 Heitzmann et al.." to -- 5,354,711 * 10/1994 Heitzmann et al.. --
Change "5,523,258 * 6/1996 Petti et al. ............ 437/186" to
-- 5,523,258    6/1996 Petti et al. ............ 437/186 --.

Column 6,
Line 3, change "SO" to -- so --.

Signed and Sealed this

Twenty-sixth Day of August, 2003

JAMES E. ROGAN
*Director of the United States Patent and Trademark Office*